(12) United States Patent
Olgaard (10) Patent No.: US 6,236,278 B1
(45) Date of Patent: May 22, 2001

(54) APPARATUS AND METHOD FOR A FAST LOCKING PHASE LOCKED LOOP

(75) Inventor: Christian Olgaard, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/505,028

(22) Filed: Feb. 16, 2000

(51) Int. Cl.[7] .............................. H03L 7/06; H03L 7/095; H03L 7/18; H03L 7/10
(52) U.S. Cl. ............................ 331/25; 331/16; 331/17; 331/18; 331/DIG. 2; 331/1 A; 327/156; 327/157; 327/159
(58) Field of Search ..................... 331/1 A, 16, 17, 331/18, 25, DIG. 2; 327/156–159; 360/50; 375/376; 455/260

(56) References Cited

U.S. PATENT DOCUMENTS

| | | |
|---|---|---|
| 4,468,632 | 8/1984 | Crowley .............................. 331/14 |
| 5,038,120 | 8/1991 | Wheatley et al. .................... 332/128 |
| 5,337,024 | 8/1994 | Collins ................................ 332/127 |
| 5,420,545 | 5/1995 | Davis et al. ........................... 331/17 |
| 5,424,687 | 6/1995 | Fukuda ................................. 331/11 |
| 5,486,867 | 1/1996 | Hsu et al. ............................ 348/516 |
| 5,907,253 | 5/1999 | Davis et al. ......................... 327/156 |
| 6,172,579 * | 1/2001 | Dacus et al. ......................... 332/128 |

\* cited by examiner

Primary Examiner—David Mis
(74) Attorney, Agent, or Firm—Baker & McKenzie (57) ABSTRACT

A control circuit for causing a phase lock loop (PLL) frequency synthesizer to achieve a fast phase lock time while also providing improved loop performance during normal phase locked operation. The phase locking time of the PLL is minimized by initially configuring the PLL to operate in a fractional mode with high frequency signals presented to the inputs of the loop phase detector, thereby producing a fast phase lock time. Once the PLL has achieved phase lock, its operation mode is transitioned to either an integer mode or an open loop mode without loss of phase lock, thus causing lower frequency signals or no signals, respectively, to be presented to the inputs of the loop phase detector and thereby significantly reducing spurious signal tones.

33 Claims, 7 Drawing Sheets

APPARATUS AND METHOD FOR A FAST LOCKING PHASE LOCKED LOOP

FIELD OF THE INVENTION

The present invention relates to Phase Locked Loops ("PLL's"), and in particular, to a PLL with a fast lock time.

BACKGROUND OF THE INVENTION

Phase Locked Loops ("PLL's") are systems which allow different signals in different systems to track with one another. One application of a PLL is in digital communication systems. In digital communication systems, the receiving system must be able generate the various frequencies necessary for processing various received signals. For example, a receiving system must be able to synthesize a specific frequency for mixing down the received signals. To accomplish this, a reference frequency is applied to the input of a PLL and a system division ratio of the PLL is set so that the output is some scaled up factor of the input. One problem common to all PLL's is that the output frequency of the PLL system will require a certain amount of time to lock up to a given input frequency. This is known as the lock time. The lock time of a PLL is highly non-linear and very difficult to control. It is desirable to reduce the lock time as much as possible so as to reduce the amount of time the system must wait for the PLL to lock.

Figure 1:
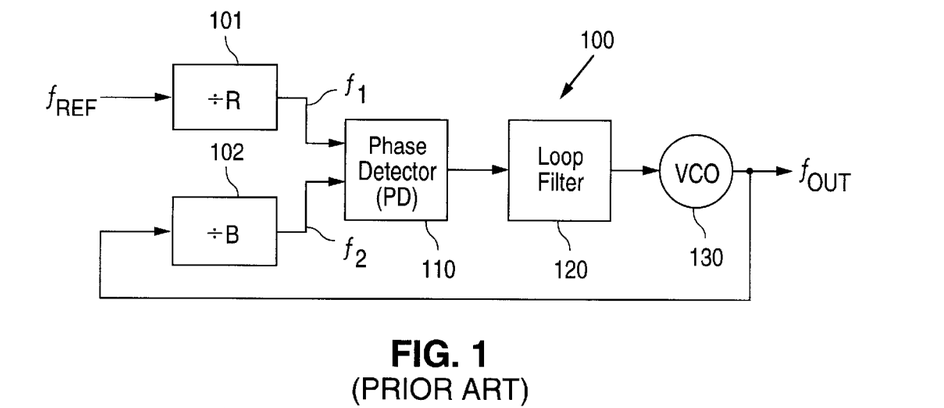
FIG. 1 is a diagram of an integer divider PLL frequency synthesizer as known in the prior art.

Frequency synthesis using a PLL is well known in the art. One example of a prior art PLL frequency synthesizer is shown in FIG. 1. The PLL 100 of FIG. 1 includes a phase detector ("PD") 110, a loop filter 120, a voltage controlled oscillator ("VCO") 130, a reference divider 101 having a divider ratio of R, and a feedback divider 102 having a divider ratio of B. The PLL 100 of FIG. 1 is known as an Integer Divider because the frequency at the output is an integer multiple of the frequency at the input of the phase detector. A fixed reference signal Fref is transmitted to the reference divider 101 and then to one input of the Phase Detector. The output of the VCO is divided by the feedback divider and input to the other input of the Phase Detector. Assuming the system is locked the following equation is satisfied:

$$F1=F2$$

$$F1=Fref/R$$

$$F2=Fout/B$$

and $$Fout=Fref\ (B/R)$$

By way of example, if Fref=10 Mhz, R=100, and B=5, then $$Fout=500\ kHz$$

Thus it can be seen that Fout will be some integer fraction of the reference frequency Fref.

Figure 2:
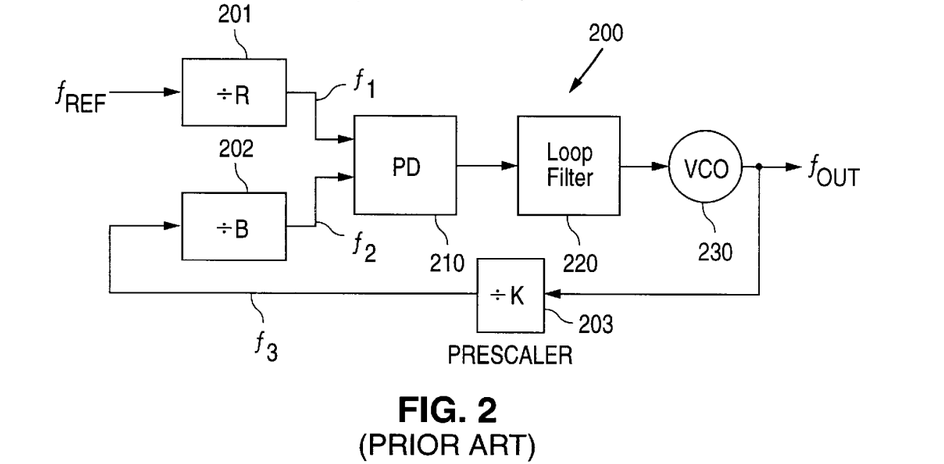
FIG. 2 is a diagram of an PLL integer divider with prescaling as known in the prior art.

Another example of a prior art PLL frequency synthesizer is shown in FIG. 2. The PLL 200 of FIG. 2 includes a phase detector ("PD") 210, a loop filter 220, a voltage controlled oscillator ("VCO") 230, a reference divider 201 having a divider ratio of R, a feedback divider 202 having a divider ratio of B, and a prescaler divider 203 having a divider ratio of K. The PLL 200 of FIG. 2 is known as an Integer Divider with Prescaling. A fixed reference signal Fref is transmitted to the reference divider 201 and then to one input of the phase detector. The output of the VCO is divided by the prescaler divider and the feedback divider, and applied to the other input of the phase detector. Again, assuming the system is locked the following equation is satisfied:

$$F1=F2$$

$$F1=Fref/R$$

$$F2=F3/B$$

$$F3=Fout/K$$

and $$Fout=Fref*K*(B/R)$$

Therefore, with prescaling, if Fref=10 Mhz, R=100, B=5, K=10, then $$Fout=5\ MHz$$

Thus it can be seen that Fout will be some integer fraction of the reference frequency Fref multiplied by the prescaler value.

Figure 3:
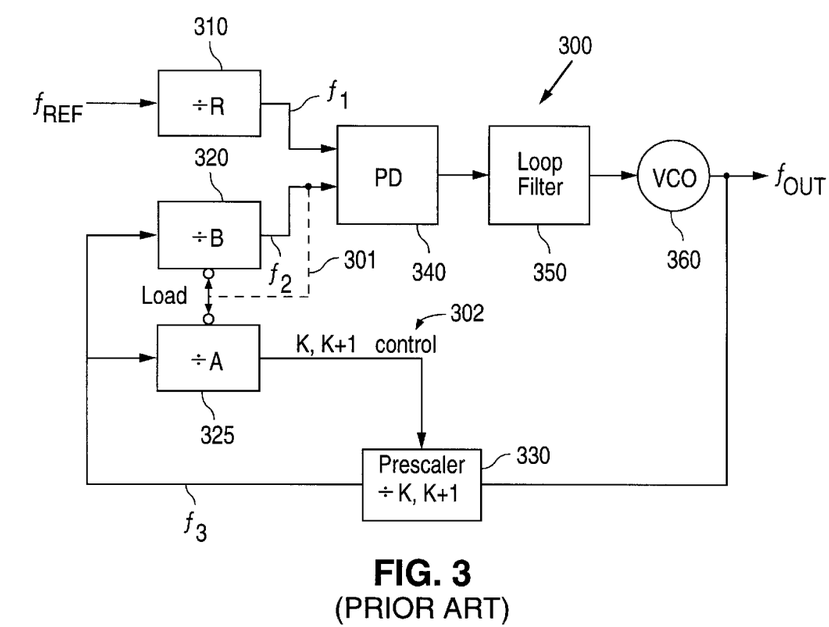
FIG. 3 is a diagram of a conventional dual modulus prescaler integer PLL.

FIG. 3 shows another example of a prior art PLL used for frequency synthesis. The PLL 300 of FIG. 3 includes a phase detector 340, a loop filter 350, a VCO 360, a reference divider 310 having a divider ratio of R, a feedback divider 320 having a divider ratio of B, an auxiliary divider 325 having a divider ratio of A, and a dual modulus prescaler 330 which can be configured to have a divide ratio of either K or K+1. Again the reference frequency is divided down before being applied to the input of the phase detector. The output signal is fed back through the dual modulus prescaler which feeds a signal to both the feedback divider and the auxiliary divider. The output of the feedback divider is applied to the other input of the phase detector.

To understand the operation of the PLL 300 of FIG. 3 by way of example, assume that both the feedback divider and auxiliary divider are DOWN counters, referred to here as B-counter and A-counter respectively. The output of the B-counter is transmitted to the input of the phase detector, and additionally, over LOAD line 301 to the load inputs of both the A-counter and B-counter. Therefore, every time the B-counter counts to zero and outputs a pulse, it will reset both the B-counter and the A-counter to their initial values. The dual modulus prescaler 330 is a divider which can divide the output, Fout, by two different integer values (in this case K and K+1) in accordance with the Prescaler Control line 302 from the A-counter. Assuming the system is locked and the B-counter has just counted down to zero and output a pulse to an input of the phase detector as well as reset the B-counter and A-counter, the signal Fout at the VCO output will be received by the dual modulus prescaler. Initially, the prescaler will divide the VCO output, Fout, by K+1 and the prescaler output will begin to supply pulses to both the B-counter and A-counter, causing each to begin to count down. When the A-counter reaches zero, a signal is transmitted over the Prescaler Control line which causes the dual modulus prescaler to reconfigure itself to stop dividing by K+1 and begin dividing by K. Thereafter, the prescaler will divide the output, Fout, by K and the prescaler output will cause the B-counter to continue to count down until it reaches zero. When the B-counter reaches zero, it outputs another pulse to the input of the phase detector. This pulse also causes the A-counter and B-counter to reset. Therefore, it can be seen that for every pulse, Npd, at the input of the phase detector, there will be Ntot pulses at the output of the VCO. Ntot can be determined by noting that while the A-counter is counting down the prescaler is dividing by K+1. Therefore, the total number of pulses at the VCO output required for the A-counter to count down to zero is A(K+1). Thereafter, the prescaler divides by K, so the total number of pulses at the VCO output required for the B-counter to finish its count down to zero is (B−A)(K) (note: the B-counter and A-counter were counting down together). Therefore, the total number of pulses at the output of the VCO, Ntot, is given by:

Ntot=A(K+1)+(B−A) K For one pulse, Npd, into the phase detector.

Ntot=A+BK or in terms of the period,

Tpd=Tout (A+BK)

Tpd=1/F1 and Tout=1/Fout

Fout=F1 (A+BK)

Therefore, the following equations are satisfied:

F1=Fref/R=F2=F3/B

F3=Fout/(K+1) For A cycles (i.e. while A is counting down)

F3=Fout/K For B−A cycles (i.e. while B is counting down after A has finished counting down.

and the VCO output frequency is given by:

Fout=(Fref/R)*(A+BK)

It can be seen that a necessary condition of this system is that the B-counter must contain a value which is equal to or larger than the value contained within the A-counter. It can be seen that other implementations besides DOWN counters could be used to implement the system of FIG. 3. Therefore, a more generic condition for the system is that the auxiliary divider must signal the prescaler and become inactive before the B-divider. This type of PLL frequency synthesizer is called a dual modulus prescaler integer PLL.

Figure 4A:
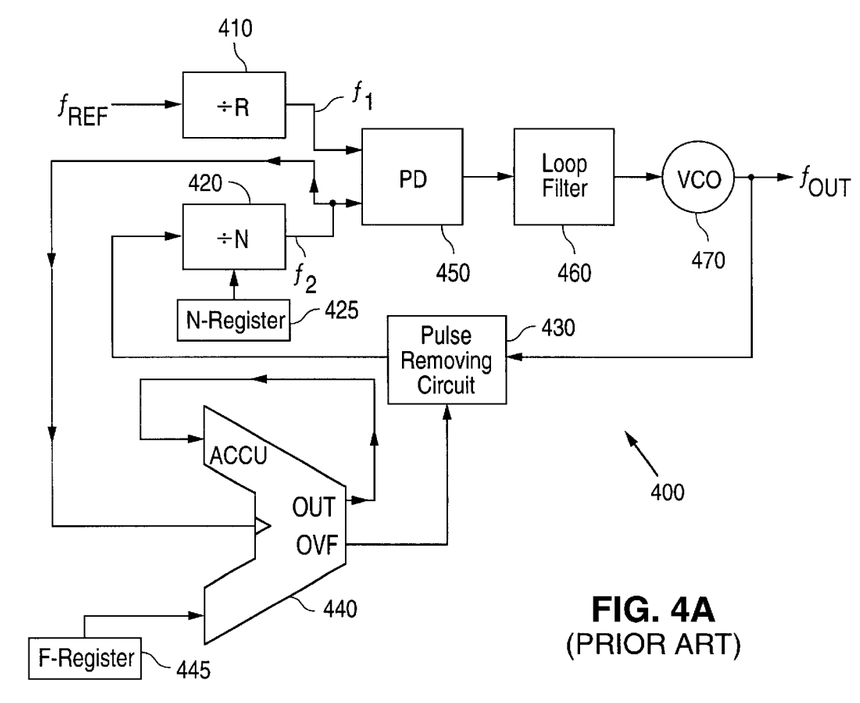
FIG. 4A is a diagram of a conventional fractional frequency synthesizer PLL as known in the prior art.

In many systems it is advantageous to synthesize a frequency which is a non-integer multiple or fraction of a reference frequency. Such frequency synthesizers are called fractional frequency synthesizers and achieve faster phase lock since the reference frequency can be increased. An example of a prior art PLL used as a fractional frequency synthesizer is shown in FIG. 4A. The fractional frequency synthesizer PLL 400 of FIG. 4 includes a phase detector 450, a loop filter 460, a VCO 470, a reference divider 410 having a divider ratio of R, a feedback divider 420 having a divider ratio of N, a pulse swallowing circuit 430, an accumulator ("accumulator") 440, an N-register 425 for storing the integer portion of a system divisor number, and an F-register 445 for storing the fractional portion of a system divisor number. The system division ratio of such a fractional PLL system is N.F, where N is the integer part and F is the fractional part. In other words, Fout=Fref (N.F). The integer and fractional parts of the division ratio are stored in the N-register and F-register, respectively.

To illustrate the operation of the fractional PLL 400, assume the system is locked and that the desired division ratio of the system is:

N=5 F=3 and N.F=5.3

Fout=Fref (5.3) for R=1

Figure 4B:
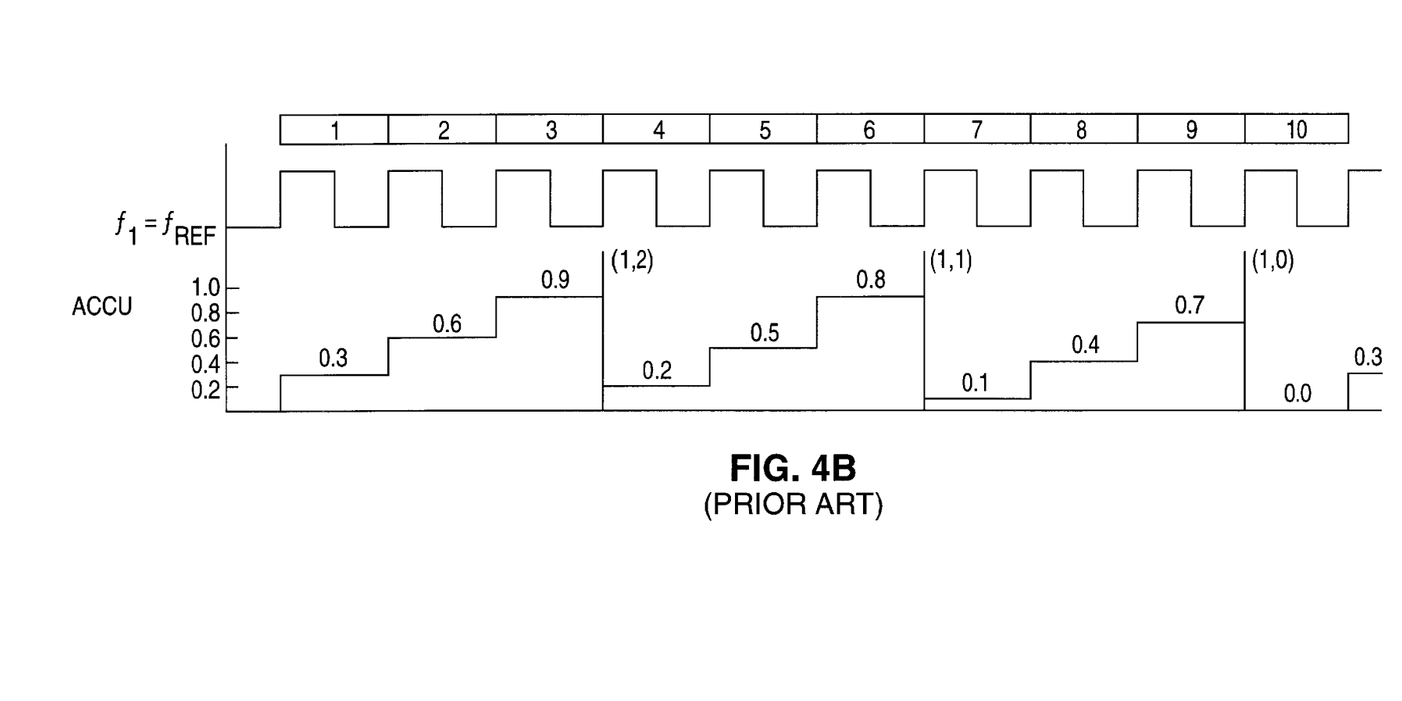
FIG. 4B is a waveform diagram illustrating the operation of the fractional frequency synthesizer PLL of FIG. 4A.

Therefore, for every 10 cycles of Fref, there will be 53 cycles of Fout. FIG. 4B illustrates the signal F1=Fref (R=1) at the input of the phase detector as well as the contents of the accumulator accumulator. During the first cycle of Fref, referred to here as the first reference cycle, the PLL attempts to divide the output of the VCO, Fout, by N.F=5.3, but this it cannot do. Instead, during the first cycle, the system divides Fout by the integer portion of the fractional divisor, N=5, which is loaded into the feedback divider. Therefore, during the first reference cycle, there is an error between F1 and F2 equal to 0.F * Fout 0.3 * Fout. The error in Fout is going to show up as a phase error in F2 at the input of the phase detector. This phase error can be represented and accounted for by using the accumulator to keep track of the error in Fout. This is accomplished by loading the value of 0.F into the accumulator and using F1 (=Fref in this case) to accumulate the error in each reference cycle. This is shown in FIG. 4B. During the first reference cycle, 0.F=0.3 is loaded into the accumulator. During the next cycle, an additional error of 0.F=0.3 is added to the current error. This continues until the phase error between F1=Fref and F2=Fout/N becomes greater than one full cycle of Fout= N*F2 (i.e., 2π radians of Fout). This corresponds to the point where the fractional error in accumulator becomes greater than unity. As shown in FIGS. 4A and 4B, when the fractional error in the accumulator exceeds unity, an overflow signal ("OVF") in the accumulator signals the pulse swallowing circuit to remove a pulse from the feedback path. The result of removing the pulse is that the feedback divider will not register one pulse of Fout. This is the same as if the feedback divider had divided by N+1=6, rather than by N=5 during that reference cycle, which will essentially delay F2 and reduce the phase error between F1 and F2. A residual error of 0.2 is maintained in the accumulator as shown in FIG. 4B. which represents the phase error between F1 and F2 after the pulse is swallowed. The error will again accumulate with each reference cycle. This process will proceed across 10 reference cycles as shown in FIG. 4B. Note that the accumulator overflows three times during the ten reference cycles. Therefore, over ten reference cycles the VCO has put out 10 * 5 cycles plus three additional pulses which were not transmitted to the feedback divider. In other words, 10 cycles of Fref produced 53 cycles of Fout, or 10*Tref=53*Tout 10/Fref=53/Fout Fout=5.3 Fref Fout=N.F Fref which is what was desired.

All of the above mentioned PLL frequency synthesizer architectures share problems associated with traditional PLL's. One problem is that at low reference frequencies, the PLL's require a longer time to lock than at high frequencies. For fractional frequency synthesizers, another problem is that at high operating frequencies PLL's have high levels of spurious tone power caused by the averaging and which can reduce system performance.

Accordingly, it would be desirable to have a PLL which could achieve a fast lock time without the spurious tone power resulting from high frequency operation.

SUMMARY OF THE INVENTION

The present invention provides a phase locked loop frequency synthesizer with a fast lock time that provides superior performance during normal operation. Lock time of the PLL is reduced by initially configuring the PLL in a fractional mode with a high frequency signal at the input of the phase detector. With a high frequency signal at the input of the phase detector, the PLL will achieve a fast lock time. After the PLL is locked, the system smoothly transitions into an integer mode, or alternatively into an open loop mode, without loosing lock. When configured in integer mode, the frequency of the signal at the input of the phase detector is reduced, thereby eliminating the averaging, thus reducing spurious tone power and resulting in improved performance. When configured in an open loop mode, the loop is "opened" by causing the output terminal of the phase detection circuit (e.g., a charge pump output) to enter a high impedance state of operation while preventing leakage of charge from such output terminal normally caused by the output stage of the phase detection circuit, thereby eliminating spurious tone power and resulting in improved performance.

In accordance with one embodiment of the present invention, a dual mode control circuit for a phase lock loop (PLL) includes a reference signal frequency divider circuit, a feedback signal frequency divider circuit and a control circuit. The reference signal frequency divider circuit is configured to couple to a PLL and receive at least one reference divider control signal and in accordance therewith receive and frequency divide an input reference signal having an input reference signal frequency and in accordance therewith provide one or more divided reference signals having one or more divided reference signal frequencies and phases. The feedback signal frequency divider circuit is configured to couple to the PLL and receive at least one feedback divider control signal and in accordance therewith receive and frequency divide a PLL feedback signal having a PLL feedback signal frequency and in accordance therewith provide one or more divided feedback signals having one or more divided feedback signal frequencies and phases. The control circuit, coupled to the reference and feedback signal frequency divider circuits, is configured to couple to the PLL, receive a PLL lock signal from the PLL and receive and process one of the one or more divided feedback signals and in accordance therewith provide the at least one reference divider control signal and the at least one feedback divider control signal. The control circuit, in accordance with the PLL lock signal, and the reference and feedback signal frequency divider circuits, in accordance with the at least one reference divider control signal and the at least one feedback divider control signal, transition between first and second circuit operation modes when: the PLL lock signal indicates that the PLL has transitioned between unlocked and phase locked states of operation; and the processing of the one of the one or more divided feedback signals indicates that a phase difference between the one of the one or more divided feedback signal phases and a desired signal phase transitions between outside and inside of a predetermined phase difference range.

In accordance with another embodiment of the present invention, a method of controlling a phase lock loop (PLL) in accordance with dual PLL operation modes includes the steps of:
coupling to a PLL;
receiving from the PLL a PLL feedback signal having a PLL feedback signal frequency;
receiving at least one reference divider control signal and in accordance therewith receiving and frequency dividing an input reference signal having an input reference signal frequency and in accordance therewith generating one or more divided reference signals having one or more divided reference signal frequencies and phases;
receiving at least one feedback divider control signal and in accordance therewith frequency dividing the PLL feedback signal and in accordance therewith generating one or more divided feedback signals having one or more divided feedback signal frequencies and phases;
receiving a PLL lock signal from the PLL and receiving and processing one of the one or more divided feedback signals and in accordance therewith generating the at least one reference divider control signal and the at least one feedback divider control signal; and
transitioning between first and second operation modes in accordance with the PLL lock signal, the at least one reference divider control signal and the at least one feedback divider control signal when
the PLL lock signal indicates that the PLL has transitioned between unlocked and phase locked states of operation, and
the processing of the one of the one or more divided feedback signals indicates that a phase difference between the one of the one or more divided feedback signal phases and a desired signal phase transitions between outside and inside of a predetermined phase difference range.

These and other features and advantages of the present invention will be understood upon consideration of the following detailed description of the invention and the accompanying drawings.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE INVENTION

Figure 5:
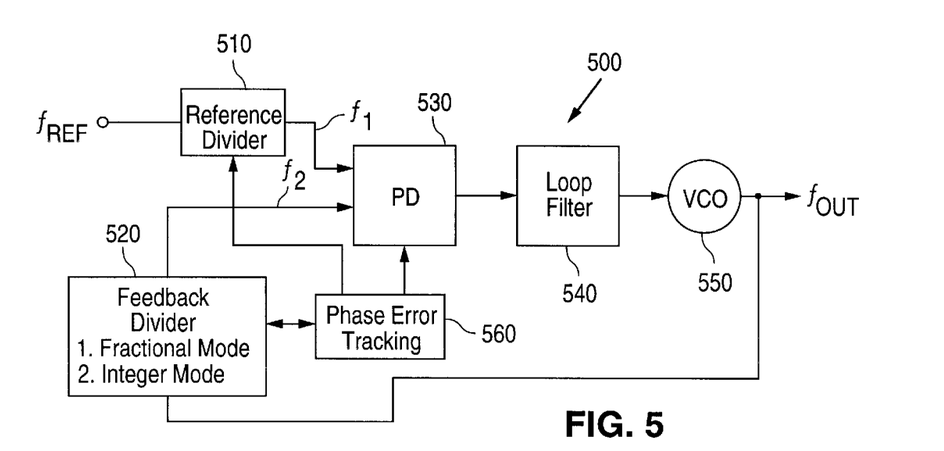
FIG. 5 is a diagram of a fast locking dual mode PLL according to one embodiment of the present invention.

Referring to FIG. 5, a PLL 500 according to one embodiment of the present invention is shown. PLL 500 includes a reference divider 510, a feedback divider 520 which can be configured in either a fractional mode or an integer mode, a phase detector 530, a loop filter 540, a voltage controlled oscillator 550, and a phase error tracking system 560. Initially, the PLL 500 is configured in a high frequency fractional mode. In high frequency fractional mode, there is a higher frequency of pulses at the input of the phase detector that will result in a fast lock time. After the loop has locked, the phase error tracking system 560 monitors the changes in phase error for each pulse cycle at the input to the phase detector. When the phase error tracking system detects a pulse cycle with a minimum phase error, the phase error tracking system reconfigures the feedback divider and the reference divider into a low frequency integer mode of operation. In a low frequency integer mode of operation, with minimum or no phase error at the input of the phase detector, the system experiences a reduction in spurious tone power. In one embodiment, when the phase error tracking system reconfigures the system, the gain of the phase detector is also reduced so that the phase detector does not overshoot the frequency of interest. In another embodiment, when the phase error tracking system reconfigures the system, the phase detector output is put into a high impedance state, and the PLL system is configured in a free running mode.

Figure 6A:
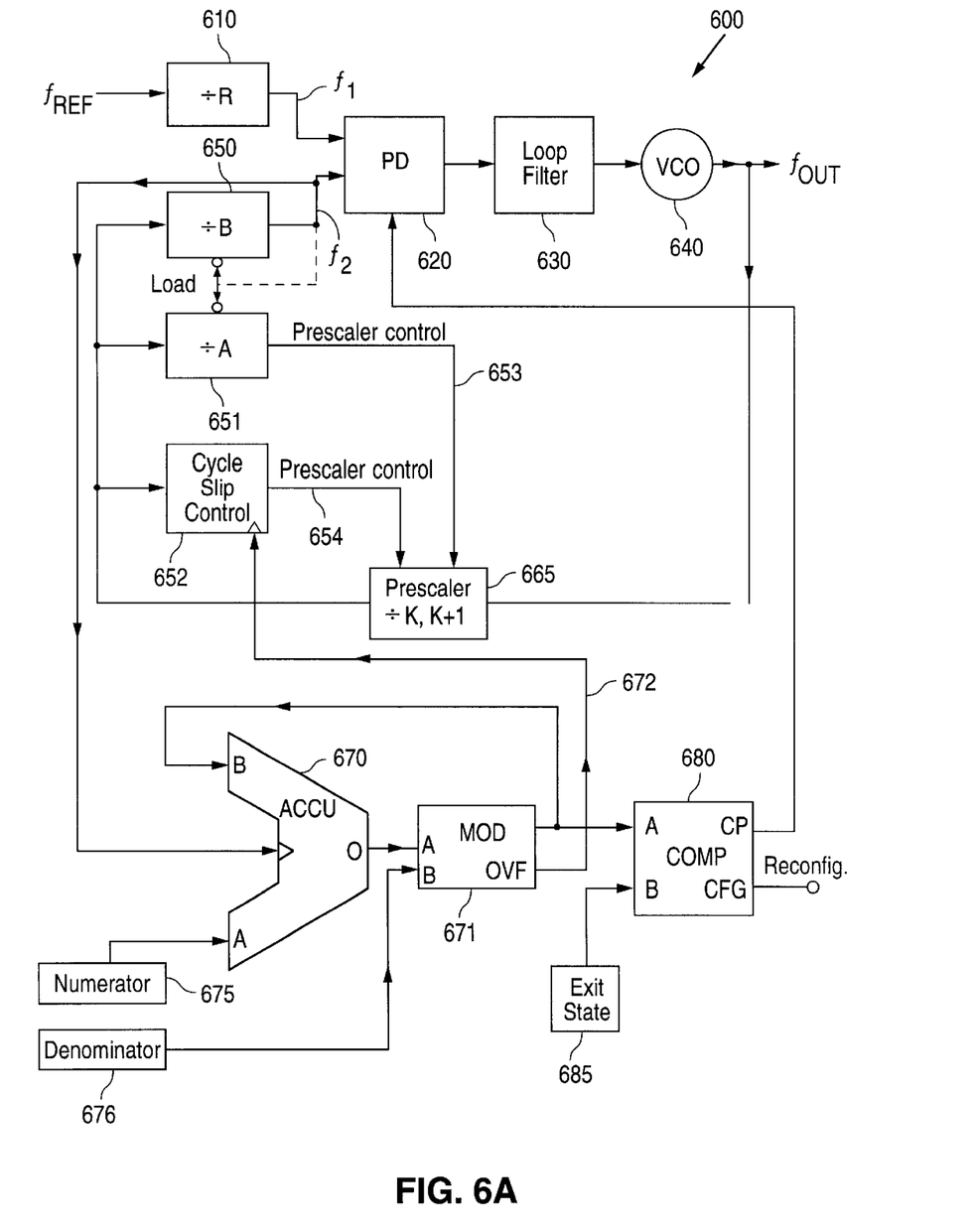
FIG. 6A is a diagram of a fast locking PLL configured in fractional mode according to one embodiment of the present invention.

FIG. 6A illustrates one embodiment of the present invention when the PLL system is in the initial fractional configuration mode of operation. In fractional mode, PLL 600 includes a reference divider 610 having a divider ratio of R, a phase detector 620, a loop filter 630, a voltage controlled oscillator ("VCO") 640, a feedback divider 650 having a divider ratio of B, an auxiliary divider 651 having a divider ratio of A, a cycle slip controller 652, a prescaler 665, an accumulator ("accumulator") 670, a modulus ("modulus") circuit 671, and a comparator circuit 680. In one embodiment, the fractional portion of the system division ratio 0.F is represented as a fraction with the numerator and denominator stored in some form of memory. For the PLL of FIG. 6A the numerator is stored in numerator register 675 and the denominator in denominator register 676, for example. PLL 600 also includes memory for storing a predetermined exit state. In one embodiment the exit state is stored in an exit state register 685.

The reference frequency, Fref, is supplied to the reference divider, divided by ratio R, and transmitted to the one input of the phase detector at F1. The output of the PLL, Fout, is divided by either N or N+1 in the prescaler 665 and fed back through the feedback divider 650 to the second input of the phase detector at F2. Assuming that the system is locked and that the feedback divider has just transmitted a pulse, the feedback divider and the auxiliary divider have just been re-loaded with their divisor ratios B and A, respectively. Initially, the prescaler control line 653 from the auxiliary divider will signal the prescaler to divide the VCO output, Fout, by N+1. The prescaler will divide the output, Fout, by N+1 for A(N+1) VCO output pulses (i.e., A pulses of the prescaler output). After A(N+1) cycles of Fout, the auxiliary divider 651 signals the prescaler 665 over the prescaler control line 653 to reconfigure itself to divide by N. The prescaler 665 will thereafter divide the VCO output, Fout, by N. After (B−A)(N) pulses of Fout (i.e., B−A pulses of the prescaler output), the feedback divider 650 transmits a pulse to the phase detector 620. Therefore, over the first reference pulse cycle (i.e., feedback divider output cycle), the frequency of the pulses at F2 is the same as for a dual modulus fractional divider and given by:

F2=Fout/(BN+A)

However, for fractional division, at the end of the first reference pulse cycle there will be a phase error between F1 and F2 as previously described. This error corresponds to the value O.F of the fractional portion of the PLL system division ratio. In the PLL of FIG. 6A, the fractional portion of the system division ratio is represented as a fraction having a numerator and denominator. The numerator value is stored in numerator register 675 and the denominator is stored in denominator register 676. Both of these values can be set during a system initialization. The numerator register 675 is connected to the A input of the accumulator 670 and the denominator register 676 is connected to the B input of modulus circuit 671. The accumulator 670 is triggered by the feedback divider 650 during each reference pulse cycle. (A reference pulse cycle, "reference cycle", or "system cycle", is the time between each feedback divider pulse, F2, to the phase detector. It may also be referred to as a phase detector cycle.) Therefore, during the first reference cycle the feedback divider triggers the accumulator to load the value of the numerator into the A-input of the accumulator. A modulus operation is then performed on the output of the accumulator and the value in denominator register 676. The result of the modulus operation is fed back to the B-input of the accumulator and added to the numerator when triggered by the feedback divider at the end of each system cycle. Therefore, for each phase detector pulse, the fractional error is stored and accumulated in the accumulator. This will continue until the fractional error between the pulses becomes greater than the pulse width. This corresponds to the situation where the modulus overflows. If the modulus operation carried out during the given reference cycle results in an overflow ("OVF"), the OVF line 672 signals the cycle slip controller 652 to add an extra N+1 divide during the current reference cycle. This extra N+1 divide will occur after the auxiliary divider 651 has finished dividing by N+1 and has signaled the prescaler 665 to begin dividing by N. In other words, if the result of a modulus operation during a given system cycle results in an OVF signal, the cycle slip controller 652 will signal the prescaler 665 to divide by N+1 for one additional period of the prescaler output (i.e. the prescaler 665 will divide by N+1 for A+1 prescaler output periods). Therefore, during a reference cycle with an OVF condition, the total number of cycles of Fout will be given by:

Ntot=(A+1)(N+1)+(B−A−1) N for one pulse, Npd, into the phase detector.

Ntot=BN+A+1

Fout=(Fref/R)*(BN+A+1)

In other words, the VCO output frequency is given by Fout=(Fref/R)*(BN+A) when an overflow event has not occurred for a given system cycle, and the VCO output frequency is given by Fout=(Fref/R)*(BN+A+1) when an overflow event has occurred for a given system cycle. (Notwithstanding these apparent differences in the VCO output frequency Fout, averaging of the VCO control signal by the loop filter causes the frequency to remain constant, albeit with a linearly varying phase.) Table 1 illustrates the accumulator values and the modulus results for a fractional divisor value of F=2/5.

TABLE 1

| ACCU A | ACCU B | ACCU OUT | (ACCU) MOD (DENOM) | OVF |
|---|---|---|---|---|
| 2 | 0 | 2 | 2/5 = 0r2 | 0 |
| 2 | 2 | 4 | 4/5 = 0r4 | 0 |
| 2 | 4 | 6 | 6/5 = 1r1 | 1 |
| 2 | 1 | 3 | 315 = 0r3 | 0 |
| 2 | 3 | 5 | 5/5 = 1r0 | 1 |
| 2 | 0 | 2 | 2/5 = 0r2 | 0 |

Figure 6B:
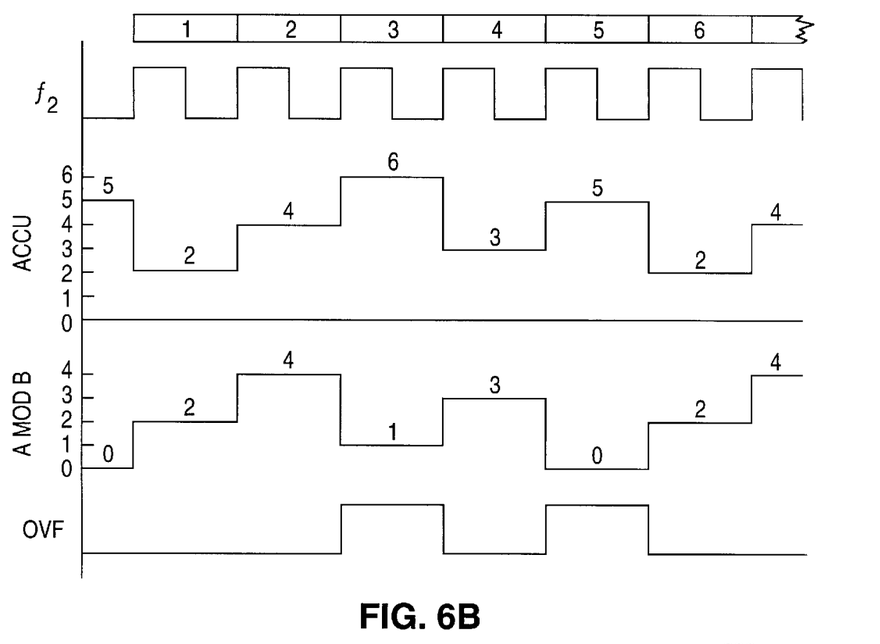
FIG. 6B is a waveform diagram illustrating the fractional mode operation of the fast locking PLL of FIG. 6A according to one embodiment of the present invention.

The operation of the PLL 600 is also illustrated FIG. 6B. During the first reference cycle, the value stored in the numerator register is added to the output of the modulus circuit. Initially, the value of the modulus circuit is zero. Therefore, for the example shown in Table 1, the value of two is added to zero and the output of the modulus circuit becomes two. In the second reference cycle, the value of two in the numerator register is added to the value of two at the output of the modulus circuit. The result at the accumulator output (four) undergoes a modulus operation with the value in the denominator register (five). The result (four) is again fed back to the input of the accumulator for the next reference cycle. During the third reference cycle the value in the numerator register (two) is added to the previous modulus result (four) and the accumulator result (six) undergoes a modulus operation with the value in the denominator register (five). This time an overflow occurs as shown in FIG. 6B. The modulus overflow is transmitted at the OVF output of the modulus circuit to the cycle slip controller 652. The cycle slip controller signals the prescaler to include an extra N+1 divide in the current reference cycle. As shown in Table 1 and in FIG. 6B, there are two such overflow events every five reference cycles. Therefore, the frequency at the output of the PLL 600 is given by:

$$F_{out} = (F_{ref}) * (BN+A) \text{ for 3 out of 5 cycles}$$

$$F_{out} = (F_{ref}/R) * (BN+A+1) \text{ for 2 out of 5 cycles}$$

$$F_{out} = (3[(F_{ref}/R)*(BN+A)] + 2[(F_{ref}/R)*(BN+A+1)])5/$$

$$F_{out} = (F_{ref}/R)*(BN+A) + (F_{ref}/R)*(2/5)$$

By way of example in a typical GSM communication system, given the desired output frequency Fout=1000.4 MHz and Fref=13 MHz, by letting N=16 (N+1=17), A=8, B=62, and R=13 we get:

$$N.F = F_{out}/(F_{ref}/R) = 1000.4 \text{ MHz}/(13 \text{ MHz}/13) = 1000.4 = 1000 + 2/5$$

$$N = 1000 \text{ and } F = 2/5$$

$$F_{out} = (13 \text{ MHz}/13) * ((62)*(16)+(8)) + 2/5(13 \text{ MHz}/13)$$

$$F_{out} = 1000.4 \text{ MHz}$$

as desired.

Figure 7A:
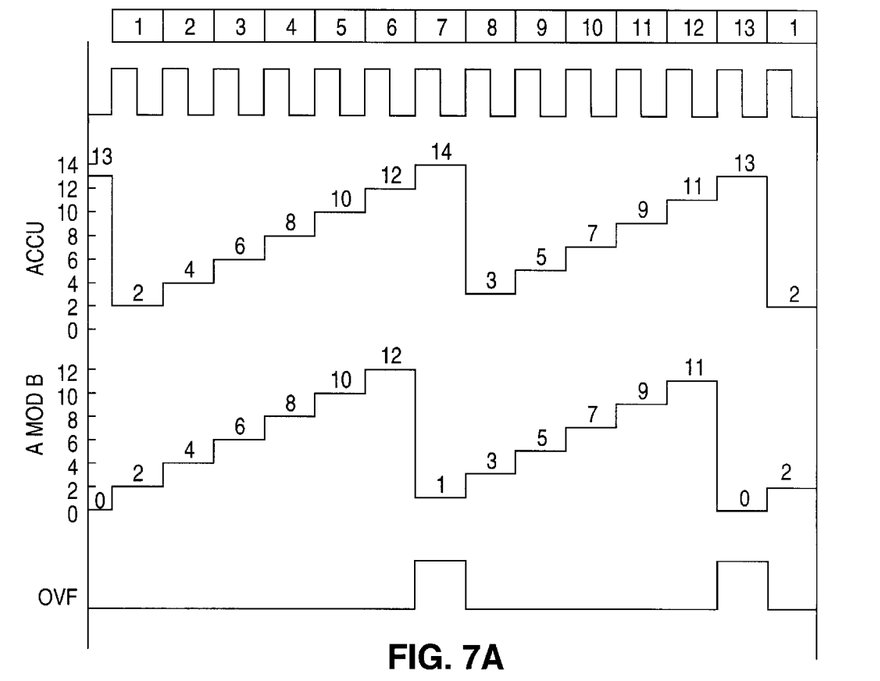
FIG. 7A is a waveform diagram illustrating the fractional mode operation of the fast locking PLL of FIG. 6A according to another embodiment of the present invention.

FIG. 7A illustrates another embodiment of the present invention. In the embodiment corresponding to the waveforms of FIG. 7A, the system reference frequency Fref is 13 MHz and the desired system output frequency Fout is 1001.4 MHz. Furthermore, in this embodiment the fractional divisor N.F is $$N.F = 385 \ 2/13$$

This system divisor ratio is achieved by letting N=16 (N+1=17), A=1, B=24, R=5, and F=N/D=2/13. Therefore, the system output frequency is given by:

$$F_{out\_ave} = (F_{ref}/R)*(BN+A) + (F_{ref}/R)*(N/D)$$

$$F_{out\_ave} = (13 \text{ MHz}/5)*((24)(16)+1) + (13 \text{ MHz}/5)*(2/13)$$

$$F_{out\_ave} = 1001 \text{ MHz} + 0.4 \text{ Mhz} = 1001.4 \text{ MHz}$$

Table 2 illustrates the accumulator values and the modulus results for a fractional divisor value of F=2/13.

TABLE 2

| ACCU A | ACCU B | ACCU OUT | (ACCU) MOD (DENOM) | OVF |
|---|---|---|---|---|
| 2 | 0 | 2 | 2/13 = 0r2 | 0 |
| 2 | 2 | 4 | 4/13 = 0r4 | 0 |
| 2 | 4 | 6 | 6/13 = 0r6 | 0 |
| 2 | 6 | 8 | 8/13 = 0r8 | 0 |
| 2 | 8 | 10 | 10/13 = 0r10 | 0 |
| 2 | 10 | 12 | 12/13 = 0r12 | 0 |
| 2 | 12 | 14 | 14/13 = 1r1 | 1 |
| 2 | 1 | 3 | 3/13 = 0r3 | 0 |
| 2 | 3 | 5 | 5/13 = 0r5 | 0 |
| 2 | 5 | 7 | 7/13 = 0r7 | 0 |
| 2 | 7 | 9 | 9/13 = 0r9 | 0 |
| 2 | 9 | 11 | 11/13 = 0r11 | 0 |
| 2 | 11 | 13 | 13/13 = 1r0 | 1 |

The operation of the system corresponding to FIG. 7A is similar to that shown in FIG 6B, However, the modulus circuit output now takes on 13 distinct values rather than only 5. The number of values corresponds to the value of the denominator of the fractional value the system is attempting to achieve. Additionally, the PLL will now adjust the reference frequency two times every 13 cycles rather than two times every 5 cycles.

Figure 7B:
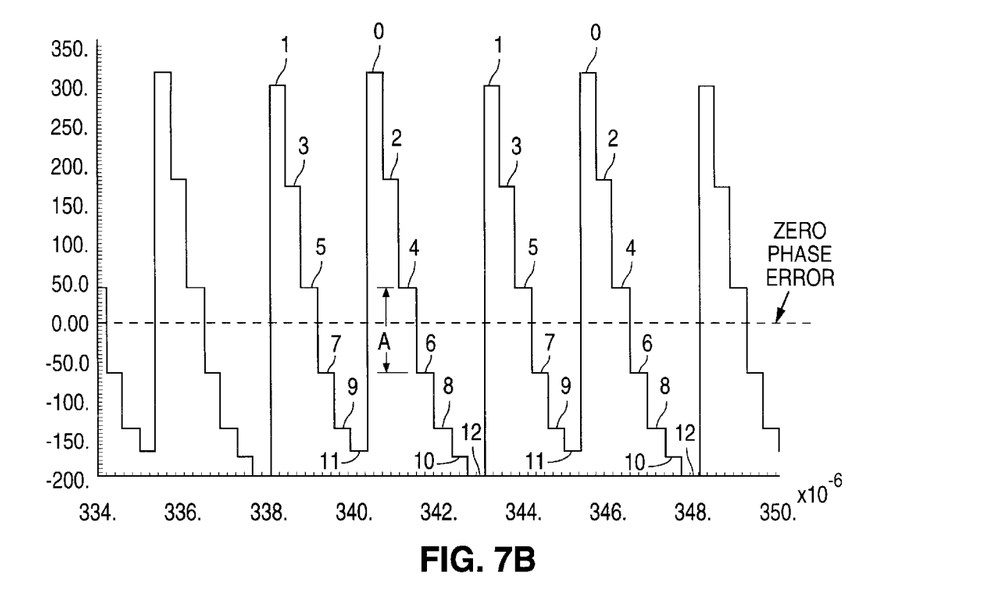
FIG. 7B is a waveform diagram illustrating the actual phase error of the fast locking PLL of FIG. 6A according to one embodiment of the present invention.

FIG. 6A and FIG. 7A illustrate another feature of the present invention. As previously stated, FIG. 6A includes phase error tracking circuitry comprised of comparator 680 and exit state register 685. As will now be explained, the phase error tracking circuitry of the embodiment illustrated in FIG. 6A will monitor the phase error of PLL 600 and reconfigure the PLL when the phase error is at a minimum. This allows the PLL system to acquire a signal in a high frequency fractional mode and then reconfigure the system into a lower frequency integer mode without loosing lock on the signal. FIG. 7B shows the actual phase error versus time of the PLL system for the fractional divisor ratio of N.F= 1001 2/13. As FIG. 7B illustrates, the actual phase error of the PLL is highly non-linear. However, FIG. 7B illustrates that the phase error can be associated with corresponding results of the modulus circuit operation. As shown in FIG. 7B, each modulus result corresponds to an actual phase error. Therefore, it can be seen that the phase error of the PLL system of FIG. 6A, when configured to operate with a system divisor ratio N.F=1001 2/13, has minimal values during the phase detector cycles when the result of the modulus operation is either A modulus B=5 or A modulus B=4. If the system is reconfigured into a lower frequency integer mode during the phase detector cycle that has the least phase error, the PLL will be able to maintain lock after the reconfiguration. Therefore, a designer can simulate the system for a given set of parameters, determine which phase detector cycle has the minimum phase error, and use modulus results to control the reconfiguration of the system.

For the embodiment of FIG. 6A, a predetermined value is stored in the exit state register during system initialization. The PLL is then configured in a high frequency fractional mode. In a high frequency fractional mode the PLL will exhibit a faster lock time. After the PLL achieves lock, the comparator 680 monitors the result of the modulus operation and compares it to the predetermined value stored in the exit state register. When the PLL cycles through a point where the result of the modulus operation corresponds to a minimum phase error, the comparator signals the system to reconfigure into a lower frequency integer mode.

Figure 8:
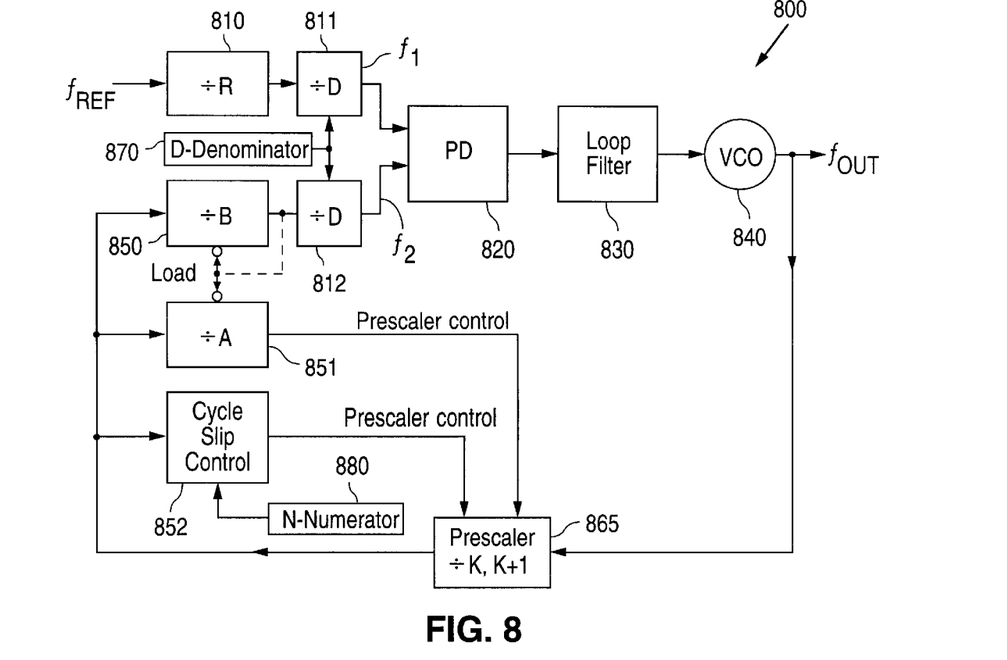
FIG. 8 is a diagram of a fast locking PLL configured in integer mode according to one embodiment of the present invention.

FIG. 8 illustrates one embodiment of a PLL system in a lower frequency integer mode according to the present invention. PLL 800 of FIG. 8 includes a phase detector 820, a loop filter 830, a VCO 840, an R-divider 810 having a division ratio of R, and a reference denominator divider 811 having a division ratio of D. The output of the VCO Fout is divided down in the feedback path by a feedback denominator divider 812 having a division ratio of D, a B-divider 850 having a division ratio of B, an auxiliary divider 851 having a division ratio of A, a cycle slip controller 852, and a prescaler divider 865. PLL 800 also includes a numerator register 880 and a denominator register 870 for storing the fraction that corresponds to the fractional portion of the divisor ratio of the PLL when configured in fractional mode.

To understand the operation of the PLL when configured in integer mode, it is important to note first that the input reference frequency Fref and the PLL output frequency Fout are the same in both the higher frequency fractional mode and the lower frequency integer mode. Secondly, it is important to note that the input to the phase detector has been reduced by a factor of D, the value of the denominator of the fractional portion of the divisor ratio for the fractional mode. Because the frequency at the input to the phase detector has been reduced by a factor equal to the denominator value of the fractional portion of the divisor ratio of the PLL when operating in fractional mode, the PLL can maintain the same frequency at the VCO output with lower frequency at the input of the phase detector. This is illustrated by noting that if an extra K+1 cycle is introduced for every N out of D output pulses of the B-divider, then the total number of VCO output pulses required to generate one pulse at the phase detector input will be:

Ntot=N(BK+A+1)+(D−N)(BK+A)

Ntot=DBK+DA+N

In other words, for one output pulse of the feedback denominator divider 812, there will be a total of D pulses (or cycles) of the B-divider 850. Additionally, for each cycle of the B-divider there will be (BK+A) cycles of the VCO output when the slip controller does not add an additional K+1 divide, and there will be (BK+A+1) cycles of the VCO output when slip controller adds an additional K+1 divide. Therefore, if an extra K+1 prescaler cycle is inserted in N (the numerator value) of the B-divider pulse cycles, then the number of VCO output pulses required to generate these N pulses is N(BK+A+1). Additionally, the number of VCO output pulses required to generate the remaining D−N B-divider pulse cycles is D−N)(BK+A). As shown in the previous equation for Ntot, adding these together gives us the total number of VCO output pulses required to generate one pulse at the output of the feedback denominator divider 812. Therefore, the VCO output frequency will be:

Fout=F2*(DBK+DA+N)

F1=Fref/R*D

F1=F2 assuming the PLL is locked

Fout=Fref (DBK+DA+N)/(R*D)

Fout=Fref D(BK+A)/R*D+(Fref/R) (N/D)

Fout=(Fref/R)(BK+A)+(Fref/R)(N/D)

This is the same output frequency as in fractional mode. However, the frequency at the phase detector has been reduced by a factor of D.

F2_int=(1/D)*Fout/((BK+A)+N/D) Integer Mode

F2_frac=Fout/((BK+A)+N/D ) Fractional Mode

The lack of phase stepping in the input to the phase detector reduces the spurious tone power of the PLL.

Figure 9:
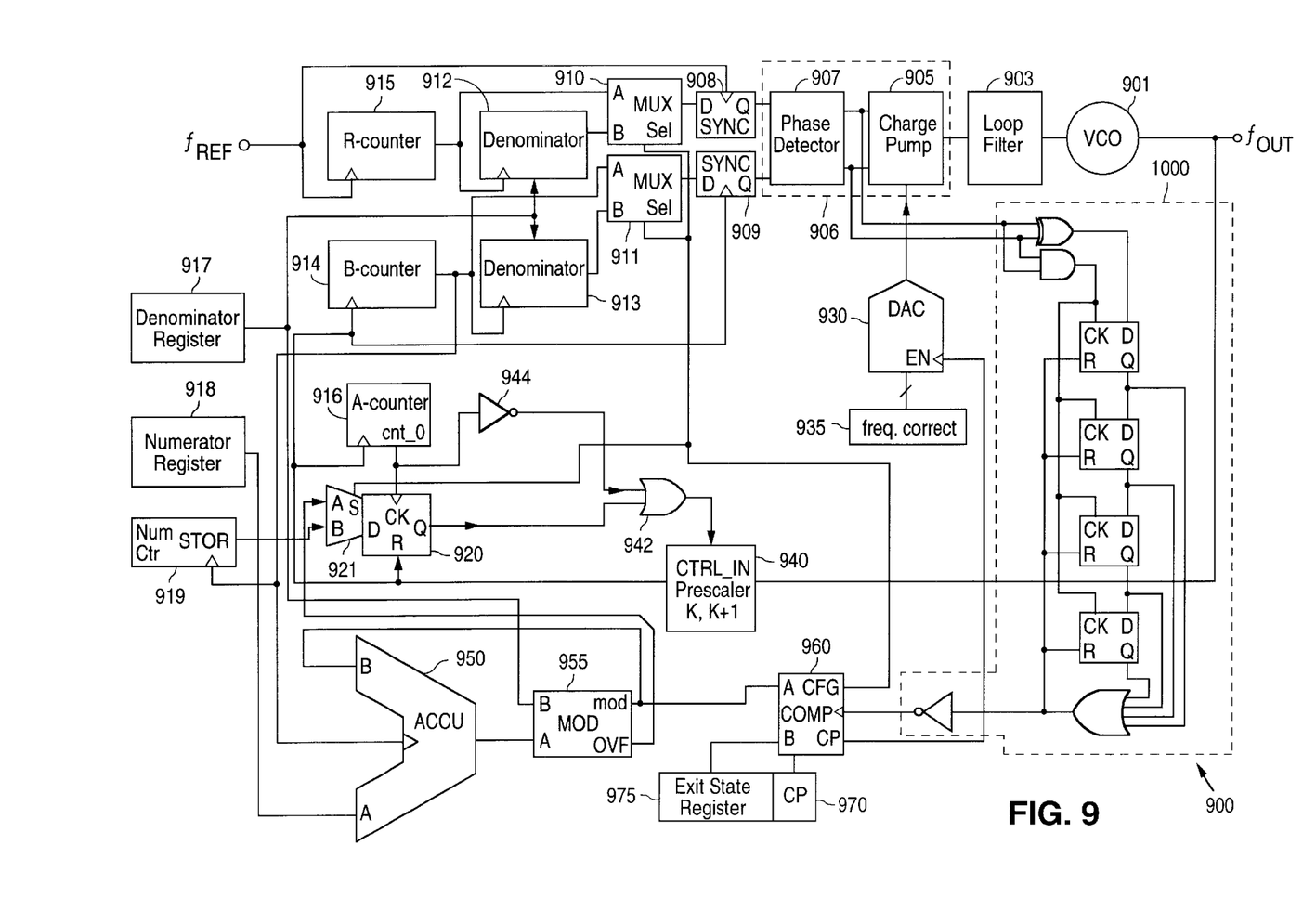
FIG. 9 is a diagram of a dual mode fast locking PLL according to one embodiment of the present invention.

Another embodiment of the present invention is shown in FIG. 9. The PLL 900 of FIG. 9 is one possible implementation of the present invention that uses down counters for the dividers. PLL 900 receives a reference frequency Fref. Fref is applied to the strobe input of a down counter R-counter 915, causing R-counter to decrement its value for every pulse of Fref. The output of R-counter 915 is transmitted to the strobe input of another counter Denom-Ctr 912. Denom-Ctr 912 is programmed with the denominator value of the fractional system divisor ratio when the PLL is operating in integer mode as will be described in more detail below. The outputs of both the Denom-Ctr 912 and the R-counter 915 are received by two inputs of a 2-1 Multiplexor ("MUX") 910. The MUX 910 is controlled by a configuration signal received on its select input. When the PLL is in Fractional Mode, the configuration signal programs the MUX to transmit the output of the R-counter. When the PLL is in Integer Mode, the configuration signal programs the MUX 910 to transmit the output of Denom-Ctr 912. The selected signal from the MUX 910 is transmitted to a synchronization circuit ("SYNC") 908 having a input coupled to the output of the MUX 910. The output of the SYNC 908 is transmitted to one input of phase detector 907. PLL 900 also includes a charge pump 905, a loop filter 903, and a VCO 901 connected substantially as shown in FIG. 9. The output of the VCO, Fout, is fed back to prescaler 940. Prescaler 940 will divide the frequency of Fout by K or K+1 depending on the state of its control input, CTRL_IN. A logic low level at the CTRL_IN input of prescaler 940 will program the prescaler to divide by K, and a logic high level at CTRL_IN will program the prescaler to divide by K+1. The output of the prescaler 940 is received by the strobe input of another down-counter B-counter 914. The output of B-counter 914 is received by yet another down-counter Denom-Ctr 913. Denom-Ctr 913 is programmed with the denominator value of the fractional system divisor ratio when the PLL is operating in integer mode as will be described in more detail below. The outputs of both the Denom-Ctr 913 and the B-counter 914 are received by two inputs of a 2-1 Multiplexor ("MUX") 911. The MUX 911 is also controlled by a configuration signal received on the select input. When the PLL is in Fractional Mode, the configuration signal programs MUX 911 to transmit the output of the B-counter. When the PLL is in Integer Mode, the configuration signal programs the MUX 911 to transmit the output of Denom-Ctr 913. The selected signal from MUX 911 is transmitted to a synchronization circuit ("SYNC") 909 having a input coupled to the output of the MUX 911. The output of SYNC 909 is transmitted to the second input of phase detector 907. SYNC circuits 908 and 909 are strobed by Fref and the prescaler 940 output, respectively, in order to ensure synchronous transfer of pulses to the input of the phase detector 907.

PLL 900 is initially configured into a Fractional Mode having a high frequency of pulses at the input of phase detector 907. Such a configuration will allow the PLL to achieve a faster lock time. Fractional operation is achieved as follows. The output of prescaler 940 is transmitted to the strobe input of A-counter 916. A-counter 916 is a down counter that will decrement every time it receives a pulse from prescaler 940. When A-counter 916 reaches a count of zero, the signal at the CNT_0 output of A-counter 916 transitions to a logic high. This signal will be inverted in an inverter 944 and program prescaler 940 to stop dividing by K+1 and begin dividing by K.

In Fractional Mode however, some phase detector cycles must include an additional K+1 division in the prescaler cycle (as described with respect to PLL 600 of FIG. 6). To accomplish this the fractional portion of the system divisor, 0.F, is represented as a fraction N/D. The denominator D is programmed into the denominator register 917 and the numerator N is programmed into the numerator register 918. During each phase detector cycle, the B-counter 914 output (which is also the input to the phase detector in Fractional Mode) triggers the accumulator 950 to add the value in the numerator register 918 to the result of a modulus circuit 955 output. The output of accumulator 950 undergoes a modulus operation with the value in the denominator register 917. If the modulus circuit 955 overflows in a given phase detector cycle, the PLL is signaled to divide Fout by K+1 for one additional cycle of the prescaler 940 in the given phase detector cycle. This is achieved by programming the slip circuit 920. Slip circuit 920 includes a multiplexor input 921. The multiplexor 921 has one input connected to the output of the modulus circuit 955 and another input connected to a numerator counter 919. When the system is configured in Fractional Mode, the select input of multiplexor 921 programs the modulus circuit OVF output to be transmitted to the slip circuit 920 input. On the other hand, when the system is configured in Integer Mode, the select input of the multiplexor circuit 921 programs the output of the numerator counter 919 to be transmitted to the slip circuit 920 input. When the modulus circuit 955 overflows in a given Fractional Mode phase detector cycle, the OVF output transmits a signal to the input of slip circuit 920. When A-counter 916 reaches zero later in the phase detector cycle, the CNT_0 output will attempt to reprogram the prescaler 940 to divide by K. However, the CNT_0 will also trigger the OVF signal into the slip circuit 920 by strobing the CK input of the slip circuit 920. This will activate the output of the slip circuit 920 and drive through OR gate 942 to program prescaler 940 to divide Fout by K+1 for one additional prescaler cycle. On the next prescaler cycle, the prescaler output pulse will reset the slip circuit 920, and the prescaler 940 will be programmed to divide the output Fout by K, rather than K+1. In this manner, one additional division by K+1 is introduced into the appropriate phase detector cycles. This will result in a fractional relation between the frequency at the input of the phase detector 907 and the output Fout.

Once the system has achieved lock, comparator 960 is enabled (or clocked) by the phase lock indicator signal from the PLL lock detection circuit 1000 and compares each modulus result to the value programmed into the exit state register 975. (It should be readily understood that, as one alternative to the PLL lock detection circuit 1000, a counter can be used to count pulses, e.g., of the output signal from the VCO 901 or prescaler 940, and after some predetermined number of such pulses the PLL is assumed to be locked. As another alternative, a counter can be used to count charge pump events, e.g., signal pulses at the output of the charge pump 905. After the frequency of such events, independent of the frequency of operation of the PLL, has declined to some predetermined value the PLL is assumed to be locked.) Each modulus result corresponds to a certain phase error between the signals at the input of the phase detector. The value programmed into the exit state register will be the value which corresponds to the phase detector cycle with minimum phase error. This can be determined by the user by simulating the system for the fractional value desired. Techniques for simulating PLL systems and obtaining the corresponding phase error characteristics are well known to those skilled in the art. When the modulus circuit outputs a modulus result equal to the value in the exit state register, the configuration output of the comparator 960 will be activated and cause the system to reconfigure into an integer mode of operation. In the PLL 900 of FIG. 9, reconfiguration is achieved by transmitting a configuration signal on the CFG output of comparator 960. The configuration signal is transmitted to MUX 910, MUX 911, and MUX 921, causing each MUX output to correspond to the B inputs rather than the A inputs. This system will now operate in Integer Mode as will now be described.

When the configuration signal is transmitted to MUX's 910 and 911 the input of the phase detector 907 receives the output of Denom-Ctr's 912 and 913. Both of these counters 912, 913 are loaded with a value from the denominator register 917.

Therefore, because the B-counter output and R-counter output are now the Denom-Ctr inputs, both inputs of the phase detector 907 are effectively reduced by a factor of D, the value in the denominator register 917. Additionally, the VCO output frequency is maintained by adding an additional K+1 prescaler division cycle in N out of D cycles of the B-counter 914 as previously discussed with respect to FIG. 8. The additional K+1 prescaler division cycles are introduced into N out of D B-counter cycles by loading the numerator counter 919 with the value of the numerator register 918 at the beginning of a phase detector cycle. When signaled by the CFG output of the comparator 960, MUX 921 will select the numerator register output CNT_0* as the input to the slip circuit. CNT_0* is logic high when the count is not equal to zero.

When the system is in lock, each phase detector cycle will include a number of B-counter cycles. The B-counter cycles will be determined by the output of the prescaler 940. For the first N B-counter cycles, the value in the numerator counter 919 will be non-zero and CNT_0* will be at a logic high. This value will be loaded into the slip circuit 920 at the end of every A-counter cycle. The result will be one additional K+1 division in the prescaler 940 for each B-counter cycle until the numerator counter 919 has counted down to zero. The count will reach zero and CNT_0* will go low after N cycles of the B-counter 914 (where N is the value programmed in the numerator register 918 and therefore the value in the numerator counter 919). For the remaining D cycles of the B-counter 914 that are required to produce a pulse at the output of the Denom-ctr 913 (where D is the denominator value), CNT_0* will be logic low, and an additional K+1 division will not be introduced into the B-counter cycle. As shown by the equations above for FIG. 8, the PLL output frequency Fout, which is also the output of the VCO 901, will be the same as in Fractional Mode.

PLL 900 of FIG. 9 also illustrates another feature of the present invention.

PLL 900 further includes a CP register 970. CP register 970 is programmed with an optional charge pump correction flag. When the output of the modulus circuit 955 produces a value corresponding to the minimum phase error, the PLL according to the present invention will reconfigure itself from Fractional Mode into Integer Mode. However, as shown in FIG. 7B, the actual phase error corresponding to a minimum modulus circuit output is not exactly zero. Therefore, CP register 970 is included to signal comparator 960 to output a charge pump correction signal on the CP output. The charge pump correction signal is used to adjust the performance of the charge pump 905 during a transition from Fractional Mode to Integer Mode.

In one embodiment, the charge pump correction signal programs the charge pump 905 directly to reduce the gain of the charge pump 905 by one-half when the system is reconfigured from Fractional Mode to Integer Mode. As illustrated by FIG. 7B, a normal charge pump pulse would cause a change in the output of the VCO 901 that would result in a phase error change represented by A. By reducing the gain of the charge pump 905 by one-half, the output shift will be reduced. Therefore, when the PLL enters Integer Mode, the initial phase error at the input of the phase detector 907 will be reduced.

Another embodiment of the charge pump correction technique is illustrated in FIG. 9. PLL 900 of FIG. 9 also includes a digital-to-analog converter ("DAC") 930 and a frequency correction register 935. Prior to programming the system, the user of the present embodiment will simulate the phase error as previously described and determine the amount of phase error that will be at the input of the phase detector 907 during a transition from Fractional Mode to Integer Mode. The frequency correction register 935 is then programmed with a value corresponding to a DAC 930 output that will adjust the characteristics of the charge pump 905 output such that the VCO 901 will shift to a position of minimum phase error in Integer Mode. In other words, when PLL 900 is operating in Fractional Mode the charge pump 905 is producing an output which adjusts the output of the VCO 901 such that the phase error at the input of the phase detector 907 follows a pattern as shown in FIG. 7B. When the system transitions into Integer Mode, the phase error correction signal is received on the enable, EN, input of the DAC 930, and the DAC 930 outputs a signal of predetermined magnitude to adjust the output of the charge pump 905 such that the resulting shift in the VCO 901 output yields a minimum phase error at the input of the phase detector 907 when the system is in Integer Mode. The output signal of the DAC 930 can be a current output or a voltage output depending on the specific implementation of the charge pump 905. Many charge pump designs are known in the prior art, and it would be evident for a skilled person in the art to determine, based on the architecture of the charge pump, whether to use a current output or voltage output DAC as well as the details of how to implement the adjustment.

For example, the enable signal EN of the DAC 930 can be set to cause the system to operate in open loop mode, e.g., whereby the appropriate voltage is applied to the loop filter 903 to ensure minimum phase error and the loop is "opened" by causing the output terminal of the phase detection stage 906, i.e., the charge pump output, to enter a high impedance state of operation. Meanwhile, leakage of charge from such output terminal normally caused by the internal output stage is prevented by sampling the voltage at the output terminal immediately following the point in time when the output terminal is placed into its high impedance state. This sampled voltage is stored across a capacitive circuit element, buffered by a buffer amplifier and fed back to the output terminal during the holding period. A more detailed description of this circuit operation can be found in commonly assigned, copending U.S. patent application Ser. No. 09/383, 162, filed Aug. 25, 1999, and entitled "Voltage Sample and Hold Circuit for Low Leakage Charge Pump" (the disclosure of which is incorporated herein by reference). (Open loop modulation techniques are used in a number of wireless communications systems, such as DECT, Bluetooth (http://www.bluetooth.com) and HomeRF (http://www.homerf.org) systems.)

In the foregoing specification, the invention has been described with reference to specific exemplary embodiments thereof. It will, however, be evident that various modifications and changes can be made thereto without departing from the broader spirit and scope of the invention as set forth in the appended claims. The specification and drawings are, accordingly, to be regarded in an illustrative rather than restrictive sense.

What is claimed is:

1. An apparatus including a dual mode control circuit for a phase lock loop (PLL), comprising:

a reference signal frequency divider circuit configured to couple to a PLL and receive at least one reference divider control signal and in accordance therewith receive and frequency divide an input reference signal having an input reference signal frequency and in accordance therewith provide one or more divided reference signals having one or more divided reference signal frequencies and phases;

a feedback signal frequency divider circuit configured to couple to said PLL and receive at least one feedback divider control signal and in accordance therewith receive and frequency divide a PLL feedback signal having a PLL feedback signal frequency and in accordance therewith provide one or more divided feedback signals having one or more divided feedback signal frequencies and phases; and a control circuit, coupled to said reference and feedback signal frequency divider circuits, configured to couple to said PLL, receive a PLL lock signal from said PLL and receive and process one of said one or more divided feedback signals and in accordance therewith provide said at least one reference divider control signal and said at least one feedback divider control signal;

wherein said control circuit, in accordance with said PLL lock signal, and said reference and feedback signal frequency divider circuits, in accordance with said at least one reference divider control signal and said at least one feedback divider control signal, transition between first and second circuit operation modes when said PLL lock signal indicates that said PLL has transitioned between unlocked and phase locked states of operation, and said processing of said one of said one or more divided feedback signals indicates that a phase difference between said one of said one or more divided feedback signal phases and a desired signal phase transitions between outside and inside of a predetermined phase difference range.

2. The apparatus of claim 1, wherein said first and second circuit operation modes comprise fractional and integer frequency synthesis modes.

3. The apparatus of claim 1, wherein said divided feedback signal frequency is equal to said divided reference signal frequency.

4. The apparatus of claim 1, wherein said at least one reference divider control signal comprises a plurality of reference divider control signals and said reference signal frequency divider circuit comprises:

at least one counter circuit configured to receive a portion of said plurality of reference divider control signals and in accordance therewith receive and frequency divide said input reference signal and in accordance therewith provide a plurality of divided reference signals; and a signal selector circuit, coupled to said at least one counter circuit, configured to receive another portion of said plurality of reference divider control signals and in accordance therewith receive all and provide one of said plurality of divided reference signals as said one or more divided reference signals.

5. The apparatus of claim 1, wherein said reference signal frequency divider circuit comprises a programmable counter circuit.

6. The apparatus of claim 1, wherein said at least one feedback divider control signal comprises a plurality of feedback divider control signals and said feedback signal frequency divider circuit comprises:

at least one counter circuit configured to receive a portion of said plurality of feedback divider control signals and in accordance therewith receive and frequency divide said PLL feedback signal and in accordance therewith provide a plurality of divided feedback signals; and a signal selector circuit, coupled to said at least one counter circuit, configured to receive another portion of said plurality of feedback divider control signals and in accordance therewith receive all and provide one of said plurality of divided feedback signals as said one or more divided feedback signals.

7. The apparatus of claim 1, wherein said feedback signal frequency divider circuit comprises a programmable counter circuit.

8. The apparatus of claim 1, wherein said control circuit comprises first and second data registers configured to store first and second pluralities of data representing a numerator and a denominator of a fraction used in said processing of said one of said one or more divided feedback signals.

9. The apparatus of claim 8, wherein said control circuit further comprises a data processing circuit, coupled to said first and second data registers, configured to receive said one of said one or more divided feedback signals and in accordance therewith receive and process said first and second pluralities of data and in accordance therewith provide said at least one reference divider control signal and said at least one feedback divider control signal.

10. The apparatus of claim 9, wherein said data processing circuit comprises:

an accumulator circuit configured to receive said one of said one or more divided feedback signals and in accordance therewith receive and accumulate one of said first and second pluralities of data and a plurality of modulus data and in accordance therewith provide a plurality of accumulated data;

a modulus circuit, coupled to said accumulator circuit, configured to receive and perform a modulus operation upon said plurality of accumulated data and in accordance therewith provide said plurality of modulus data; and a state comparison circuit, coupled to said modulus circuit, configured to receive and compare said modulus data and a plurality of predetermined state data representing a desired PLL operational state and in accordance therewith provide said at least one feedback divider control signal.

11. The apparatus of claim 1, further comprising a signal comparison circuit, coupled to said reference and feedback signal frequency divider circuits, configured to receive and compare said divided reference and feedback signals and in accordance therewith provide at least one PLL control signal representing a difference between said divided reference and feedback signal frequencies.

12. The apparatus of claim 11, wherein said signal comparison circuit comprises a phase detector circuit configured to compare said divided reference and feedback signal phases and in accordance therewith provide said at least one PLL control signal representing a difference between said divided reference and feedback signal phases.

13. The apparatus of claim 11, further comprising a signal filter circuit, coupled to said signal comparison circuit, configured to receive and filter said at least one PLL control signal and in accordance therewith provide a filtered control signal.

14. The apparatus of claim 13, further comprising a frequency-controlled signal source, coupled to said signal filter circuit, configured to receive said filtered control signal and in accordance therewith provide said PLL feedback signal.

15. The apparatus of claim 14, wherein said frequency-controlled signal source comprises a voltage-controlled oscillator circuit.

16. The apparatus of claim 1, wherein:

said control circuit is further configured to provide a loop control signal having first and second loop control signal states corresponding to when said PLL lock signal indicates that said PLL is in said unlocked and phase locked states of operation; and said apparatus further comprises a signal comparison circuit, coupled to said control circuit and said reference and feedback signal frequency divider circuits, configured to receive said loop control signal and receive and compare said divided reference and feedback signals and in accordance therewith provide at least one PLL control signal representing a difference between said divided reference and feedback signal frequencies when said loop control signal is in said first loop control signal state.

17. The apparatus of claim 16, wherein said signal comparison circuit includes an output terminal which is configured to convey said at least one PLL control signal when said loop control signal is in said first loop control signal state and to operate in a high impedance state when said loop control signal is in said second loop control signal state.

18. A method of controlling a phase lock loop (PLL) in accordance with dual PLL operation modes, comprising the steps of:

coupling to a PLL;

receiving from said PLL a PLL feedback signal having a PLL feedback signal frequency;

receiving at least one reference divider control signal and in accordance therewith receiving and frequency dividing an input reference signal having an input reference signal frequency and in accordance therewith generating one or more divided reference signals having one or more divided reference signal frequencies and phases;

receiving at least one feedback divider control signal and in accordance therewith frequency dividing said PLL feedback signal and in accordance therewith generating one or more divided feedback signals having one or more divided feedback signal frequencies and phases;

receiving a PLL lock signal from said PLL and receiving and processing one of said one or more divided feedback signals and in accordance therewith generating said at least one reference divider control signal and said at least one feedback divider control signal; and transitioning between first and second operation modes in accordance with said PLL lock signal, said at least one reference divider control signal and said at least one feedback divider control signal when said PLL lock signal indicates that said PLL has transitioned between unlocked and phase locked states of operation, and said processing of said one of said one or more divided feedback signals indicates that a phase difference between said one of said one or more divided feedback signal phases and a desired signal phase transitions between outside and inside of a predetermined phase difference range.

19. The method of claim 18, wherein said step of transitioning between said first and second operation modes comprises transitioning between fractional and integer frequency synthesis modes.

20. The method of claim 18, wherein said divided feedback signal frequency is equal to said divided reference signal frequency.

21. The method of claim 18, wherein said step of receiving at least one reference divider control signal and in accordance therewith receiving and frequency dividing an input reference signal having an input reference signal frequency and in accordance therewith generating one or more divided reference signals having one or more divided reference signal frequencies and phases comprises:

receiving a plurality of reference divider control signals as said at least one reference divider control signal;

receiving a portion of said plurality of reference divider control signals and in accordance therewith receiving and frequency dividing said input reference signal and in accordance therewith generating a plurality of divided reference signals; and receiving another portion of said plurality of reference divider control signals and in accordance therewith receiving all and selecting one of said plurality of divided reference signals as said one or more divided reference signals.

22. The method of claim 18, wherein said step of receiving at least one reference divider control signal and in accordance therewith receiving and frequency dividing an input reference signal having an input reference signal frequency and in accordance therewith generating one or more divided reference signals having one or more divided reference signal frequencies and phases comprises:

programming a signal divisor in accordance with said at least one reference divider control signal; and frequency dividing said input reference signal and in accordance therewith generating said one or more divided reference signals in accordance with said programmed signal divisor.

23. The method of claim 18, wherein said step of receiving at least one feedback divider control signal and in accordance therewith frequency dividing said PLL feedback signal and in accordance therewith generating one or more divided feedback signals having one or more divided feedback signal frequencies and phases comprises:

receiving a plurality of feedback divider control signals as said at least one feedback divider control signal;

receiving a portion of said plurality of feedback divider control signals and in accordance therewith receiving and frequency dividing said PLL feedback signal and in accordance therewith generating a plurality of divided feedback signals; and receiving another portion of said plurality of feedback divider control signals and in accordance therewith receiving all and selecting one of said plurality of divided feedback signals as said one or more divided feedback signals.

24. The method of claim 18, wherein said step of receiving at least one feedback divider control signal and in accordance therewith frequency dividing said PLL feedback signal and in accordance therewith generating one or more divided feedback signals having one or more divided feedback signal frequencies and phases comprises:

programming a signal divisor in accordance with said at least one feedback divider control signal; and frequency dividing said PLL feedback signal and in accordance therewith generating said one or more divided feedback signals in accordance with said programmed signal divisor.

25. The method of claim 18, wherein said step of receiving a PLL lock signal from said PLL and receiving and processing one of said one or more divided feedback signals and in accordance therewith generating said at least one reference divider control signal and said at least one feedback divider control signal comprises:

storing data representing a numerator and a denominator of a fraction; and processing said one of said one or more divided feedback signals in accordance with said fraction.

26. The method of claim 25, further comprising the step of receiving said one of said one or more divided feedback signals and in accordance therewith receiving and processing said first and second pluralities of data and in accordance therewith generating said at least one reference divider control signal and said at least one feedback divider control signal.

27. The method of claim 26, wherein said step of receiving said one of said one or more divided feedback signals and in accordance therewith receiving and processing said first and second pluralities of data and in accordance therewith generating said at least one reference divider control signal and said at least one feedback divider control signal comprises:

receiving said one of said one or more divided feedback signals and in accordance therewith receiving and accumulating one of said first and second pluralities of data and a plurality of modulus data and in accordance therewith generating a plurality of accumulated data;

receiving and performing a modulus operation upon said plurality of accumulated data and in accordance therewith generating said plurality of modulus data; and receiving and comparing said modulus data and a plurality of predetermined state data representing a desired PLL operational state and in accordance therewith providing said at least one feedback divider control signal.

28. The method of claim 18, further comprising the step of comparing said divided reference and feedback signals and in accordance therewith generating at least one PLL control signal representing a difference between said divided reference and feedback signal frequencies.

29. The method of claim 28, wherein said step of comparing said divided reference and feedback signals and in accordance therewith generating at least one PLL control signal representing a difference between said divided reference and feedback signal frequencies comprises comparing said divided reference and feedback signal phases and in accordance therewith generating said at least one PLL control signal representing a difference between said divided reference and feedback signal phases.

30. The method of claim 28, further comprising the step of filtering said at least one PLL control signal and in accordance therewith generating a filtered control signal.

31. The method of claim 30, further comprising the step of generating a frequency-controlled signal as said PLL feedback signal in accordance with said filtered control signal.

32. The method of claim 18, further comprising the steps of:

generating a loop control signal having first and second loop control signal states corresponding to when said PLL lock signal indicates that said PLL is in said unlocked and phase locked states of operation; and comparing said divided reference and feedback signals and in accordance therewith generating at least one PLL control signal representing a difference between said divided reference and feedback signal frequencies when said loop control signal is in said first loop control signal state.

33. The method of claim 32, wherein:

said step of comparing said divided reference and feedback signals and in accordance therewith generating at least one PLL control signal representing a difference between said divided reference and feedback signal frequencies when said loop control signal is in said first loop control signal state comprises conveying said at least one PLL control signal via a signal terminal when said loop control signal is in said first loop control signal state; and said method further comprises operating said signal terminal in a high impedance state when said loop control signal is in said second loop control signal state.

* * * * *